US012787623B2

(12) United States Patent
Yoo et al.

(10) Patent No.: US 12,787,623 B2

(45) Date of Patent: Nov. 3, 2026

(54) DISPLAY DEVICE

(71) Applicant: LG Display Co., Ltd., Seoul (KR)

(72) Inventors: Taeyeon Yoo, Goyang-si (KR); Dongjoo Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 344 days.

(21) Appl. No.: 18/417,848

(22) Filed: Jan. 19, 2024

(65) Prior Publication Data

US 2024/0260438 A1 Aug. 1, 2024

(30) Foreign Application Priority Data

Jan. 31, 2023 (KR) ........................ 10-2023-0012394

(51) Int. Cl.

| | |
|---|---|
| ***H10K 59/88*** | (2023.01) |
| ***G06F 3/041*** | (2006.01) |
| ***H10K 59/131*** | (2023.01) |
| ***H10K 59/40*** | (2023.01) |

(52) U.S. Cl.

CPC ........... *H10K 59/88* (2023.02); *G06F 3/0412* (2013.01); *H10K 59/131* (2023.02); *H10K 59/40* (2023.02); *G06F 2203/04111* (2013.01)

(58) Field of Classification Search

CPC ....... H10K 59/88; H10K 59/131; H10K 59/40

See application file for complete search history.

(56) References Cited

U.S. PATENT DOCUMENTS

| | | | | |
|---|---|---|---|---|
| 10,854,843 | B2 | 12/2020 | Gwon et al. | |
| 11,307,695 | B2 | 4/2022 | Gwon et al. | |
| 11,656,709 | B2 | 5/2023 | Gwon et al. | |
| 2016/0204184 | A1* | 7/2016 | Park .................... | H10D 86/441 257/774 |
| 2017/0302772 | A1 | 10/2017 | Zhang et al. | |
| 2019/0131572 | A1 | 5/2019 | Gwon et al. | |
| 2021/0041976 | A1 | 2/2021 | Gwon et al. | |
| 2022/0197426 | A1 | 6/2022 | Gwon et al. | |

FOREIGN PATENT DOCUMENTS

| | | | |
|---|---|---|---|
| CN | 114784016 | A * | 3/2022 |
| KR | 10-2016-0087978 | A | 7/2016 |
| KR | 10-2018-0129993 | A | 12/2018 |
| KR | 10-2414940 | B1 | 6/2022 |

* cited by examiner

*Primary Examiner* — Matthew L Reames

(74) *Attorney, Agent, or Firm* — Fenwick & West LLP

(57) ABSTRACT

A display device includes: a substrate including a display area and a non-display area disposed around the display area, wherein the non-display area has a pad area; pads disposed on the substrate and in the pad area; crack blocking layers disposed on the substrate and in the pad area, and positioned adjacent to ends of the pads; and a data driver chip mounted on the substrate and in the pad area, wherein the data driver chip includes bumps respectively connected to the pads, wherein the crack blocking layers overlap ends of the bumps in a plan view of the display device.

17 Claims, 7 Drawing Sheets

DISPLAY DEVICE

CROSS-REFERENCE TO RELATED APPLICATION

This application claims priority from Korean Patent Application No. 10-2023-0012394 filed on Jan. 31, 2023 in the Korean Intellectual Property Office, and all the benefits accruing therefrom under 35 U.S.C. 119, the contents of which in its entirety are herein incorporated by reference.

BACKGROUND

Field

The present disclosure relates to a display device.

Description of Related Art

Specific examples of a flat display device include liquid a crystal display device (LCD), an organic light-emitting display device (OLED), an inorganic light-emitting display device, a quantum dot display device, a micro light-emitting diode display panel, and an electrophoresis display panel, etc.

The display device at least includes a gate driver and a data driver to drive pixels of a display panel.

Recently, in order to reduce a bezel area of the display device, the gate driver is formed directly on one side or each of both opposing sides of a display area of a flexible display panel in a GIP (gate in panel) scheme via a process of forming a thin-film transistor. Moreover, the data driver is manufactured into an IC chip which is then directly mounted on a pad provided in a non-display area of the flexible display panel using an anisotropic conductive film in a COP (chip on plastic) scheme.

SUMMARY

When respectively mounting the data driver IC chips directly on the pads provided in the non-display area of the flexible display panel, a pressure is applied thereto. In this regard, upon being pressed by bumps of the data driver IC chip, conductive balls disposed in the anisotropic conductive film may cause cracks in inorganic material layers disposed around the pads.

Due to moisture penetrating through the cracks created in the inorganic material layers, the conductive balls may be oxidized and thus the inorganic material layers and the pads may be separated from an underlying layer. As a result, an electrical connection between the data driver IC chip and the display panel may be broken such that an operation failure of the display panel may occur.

Accordingly, the inventors of the present disclosure have invented a display device that can prevent the cracks from propagating downward even if the cracks occur in the uppermost inorganic material layer due to the conductive balls in a pad area.

A technical purpose according to an embodiment of the present disclosure is to provide a display device in which an operation failure can be prevented from occurring in the display panel due to the cracks caused by the conductive balls in the pad area.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A display device configured to achieve the above purpose includes a substrate including a display area and a non-display area surrounding the display area, wherein the non-display area has a pad area; pads disposed on the substrate and in the pad area; crack blocking layers disposed on the substrate and in the pad area, and positioned adjacent to ends of the pads; and a data driver chip mounted on the substrate and in the pad area via an anisotropic conductive film, wherein the data driver chip includes bumps respectively connected to the pads, wherein the crack blocking layers overlap ends of the bumps in a plan view of the display device.

Specific details of other embodiments are included in the detailed descriptions and drawings.

According to embodiments of the present disclosure, the crack blocking layer made of metal may be disposed immediately under the touch insulating layer as an inorganic insulating layer as the topmost layer in the pad area so as to vertically overlap the ends of the input and output bumps of the data driver chip. Thus, even when the crack occurs in the touch insulating layer due to the conductive balls pressed by the input and output bumps, the crack propagation may be blocked by the crack blocking layer such that the crack may be prevented from propagating to the touch buffer layer as another inorganic insulating layer disposed under the touch insulating layer.

According to embodiments of the present disclosure, each of the second crack blocking layers connecting adjacent ones of the first crack blocking layers overlapping the ends of the input and output bumps of the data driver chip is disposed between two adjacent pads. Thus, even when the crack occurs in a portion of the touch insulating layer between the pads due to the conductive balls under the misalignment of the input and output bumps of the data driver chip, the crack propagation may be blocked by the second crack blocking layers such that the crack may be prevented from propagating to the touch buffer layer as another inorganic insulating layer disposed under the touch insulating layer.

Therefore, the inorganic material layers and the pads may be prevented from being separated from the underlying layer due to moisture penetrating along the cracks created in the inorganic material layers in the pad area. Thus, the operation failure in the display panel may be prevented from occurring.

Effects of the present disclosure are not limited to the effects mentioned above, and other effects not mentioned will be clearly understood by those skilled in the art from the descriptions below.

DETAILED DESCRIPTIONS

Figure 1:
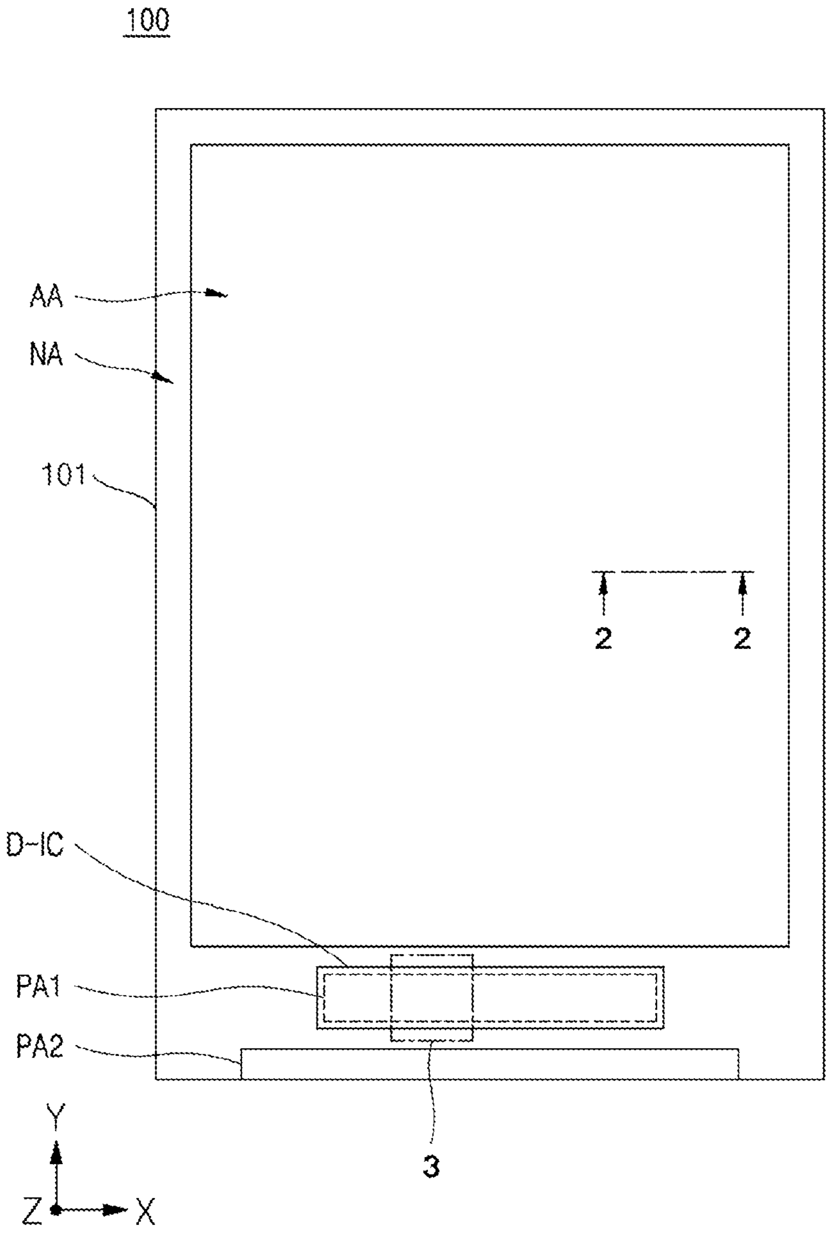
FIG. 1 is a plan view showing a display device according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers.

It will be understood that when an element or layer is referred to as being "connected to", or "coupled to" another element or layer, it may be directly, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, display devices according to embodiments according to the present disclosure will be described in detail with reference to the attached drawings.

Figure 2:
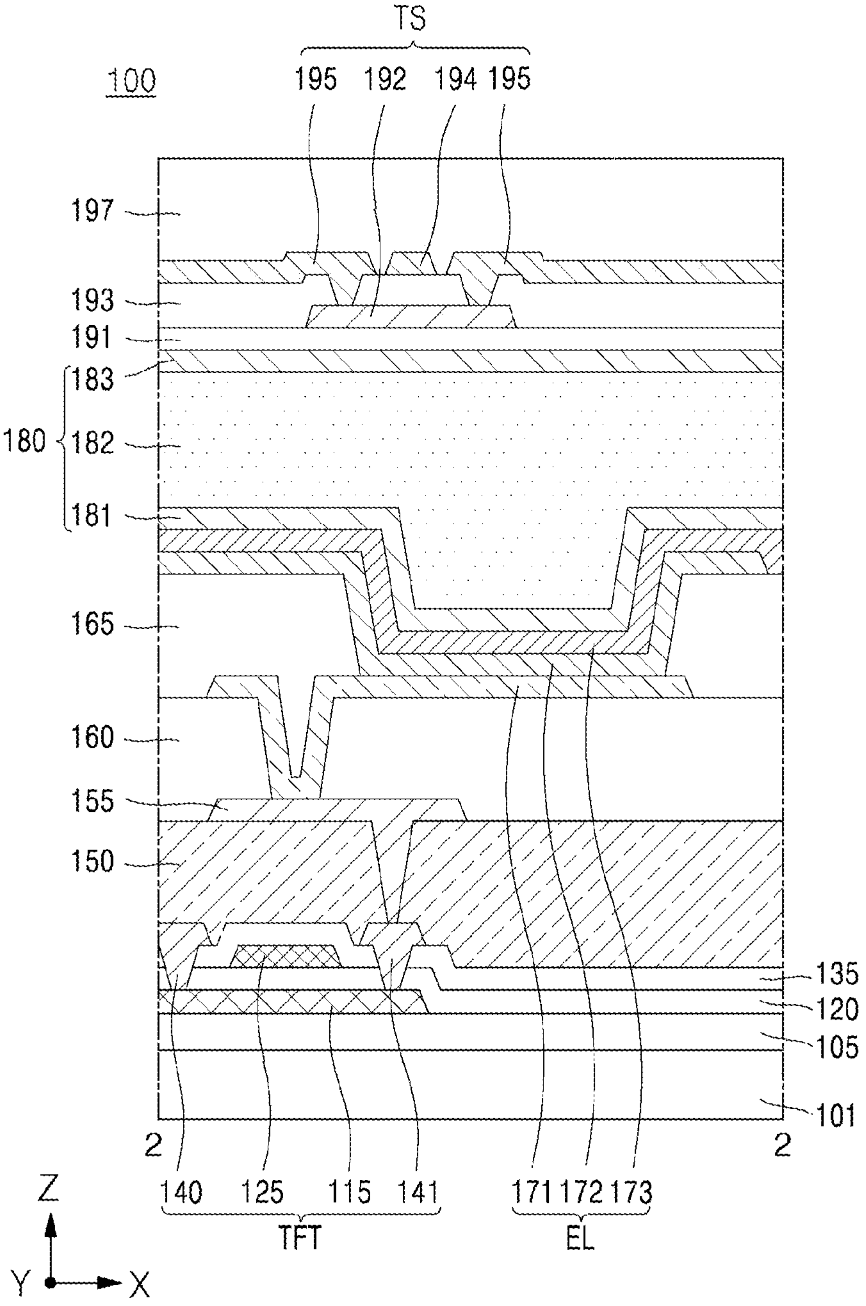
FIG. 2 is a cross-sectional view cut along a line 2-2 in FIG. 1.
Figure 3:
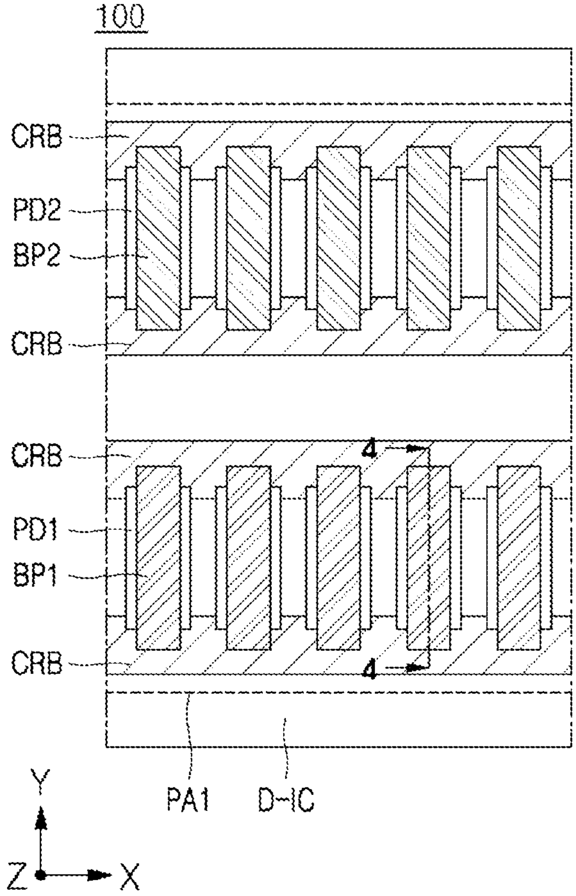
FIG. 3 is a plan view showing an area 3 in FIG. 1.
Figure 4:
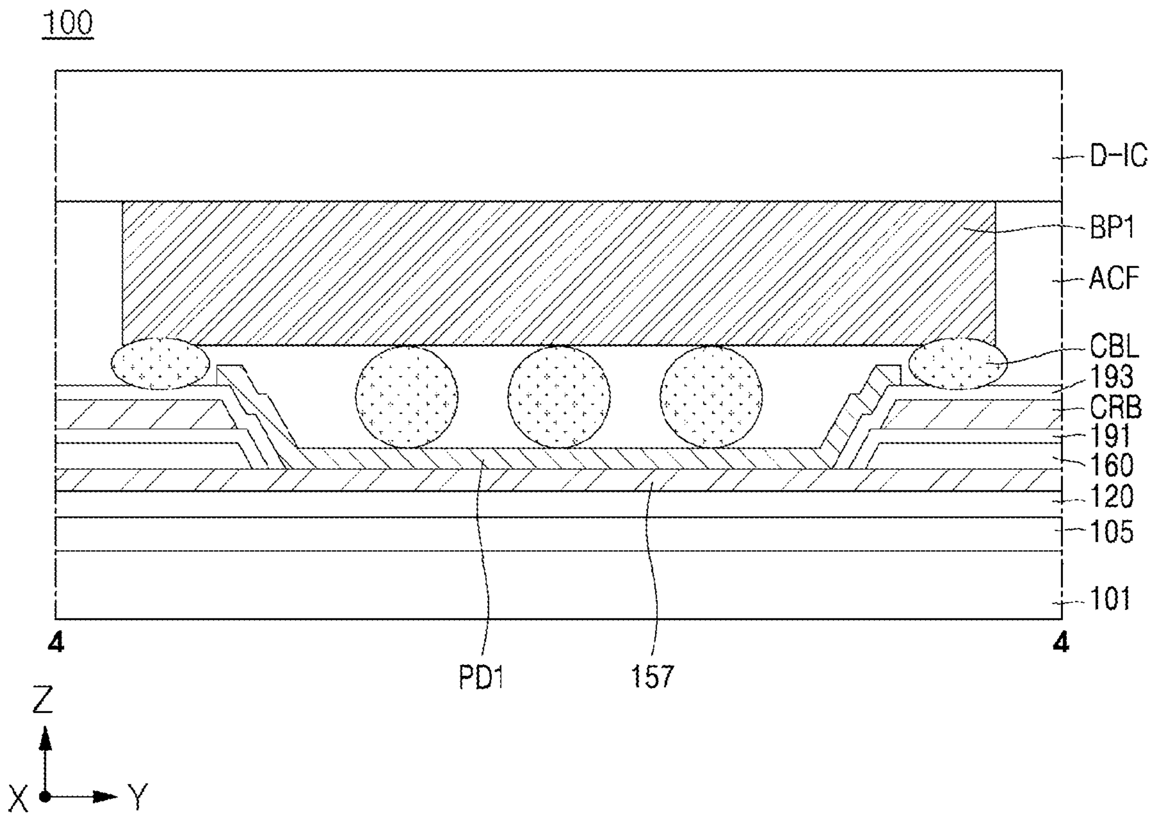
FIG. 4 is a cross-sectional view cut along a line 4-4 in FIG. 3.

FIG. 1 is a plan view showing a display device according to one embodiment of the present disclosure. FIG. 2 is a cross-sectional view cut along a 2-2 line in FIG. 1. FIG. 3 is a plan view showing an area 3 in FIG. 1. FIG. 4 is a cross-sectional view cut along a 4-4 line in FIG. 3.

Referring to FIG. 1, a display device 100 according to an embodiment of the present disclosure may include a display area AA where an image is displayed, and a non-display area NA disposed around the display area AA. The display area AA and the non-display area NA may be areas of a substrate 101.

The display area AA is an area where a plurality of pixels are disposed and the image is displayed. Each of the pixels may include a plurality of sub-pixels, without being limited thereto. Each of the sub-pixels is an individual unit that emits light, and may for example, emit red, green, blue, or white light. However, the present disclosure is not limited thereto. Other colors such as cyan, magenta, or yellow, etc. may also be possible. A light-emitting element and pixel circuitry for driving the light-emitting element may be disposed in each sub-pixel of the display area AA. The pixel circuitry may include at least one thin-film transistor and at least one capacitor. The light-emitting element may be, for example, an organic light-emitting diode or an inorganic light-emitting diode, without being limited thereto.

The non-display area NA is an area where the image is not displayed, and is an area where a driver circuit and various lines are disposed to drive the plurality of sub-pixels disposed in the display area AA. For example, a gate driver circuit may be disposed in the non-display area NA. The gate driver circuit may be formed directly on the substrate 101 and in the non-display area NA. Embodiments are not limited thereto. As an example, at least a portion of the non-display area NA may be bent to the rear surface of the substrate 101, and may be omitted from the front surface of the display device 100. As an example, the gate driver circuit may be disposed separately, and be connected to the non-display area NA, for example, by a tape automated bonding TAB method, a chip-on-glass COG method, or a chip-on-film COF method, etc.

The non-display area NA may be an area partially or fully surrounding an edge of the display area AA, as shown in FIG. 1. In FIG. 1, the non-display area NA is shown as surrounding a rectangular display area AA. However, the present disclosure is not limited thereto. Each of the display area AA and non-display area NA may have a shape suitable for a design of an electronic device in which the display device 100 is mounted. An example shape of the display area AA may be pentagonal, hexagonal, circular, oval, etc. However, the present disclosure is not limited thereto. As an example, the display area AA and non-display area NA may have the same shape or different shapes.

The non-display area NA may include a first pad area PA1 where a data driver chip D-IC is mounted and a second pad area PA2 to which an external driving module is coupled, without being limited thereto. The first pad area PA1 and the second pad area PA2 may be disposed in one side of the non-display area NA, or in more than one side of the non-display area NA. The first pad area PA1 and the second pad area PA2 may be disposed, for example, in a lower side of the non-display area NA in the plan view of the display device. However, the present disclosure is not limited thereto. The external driving module may include, for example, a printed circuit board or a flexible printed circuit board. As an example, a timing controller and/or a power management IC chip may be mounted on the printed circuit board or the flexible printed circuit board.

Signal lines may be disposed between the display area AA and the first pad area PA1, and between the first pad area PA1 and the second pad area PA2.

Referring to FIG. 2, the display device 100 according to one embodiment of the present disclosure may include a thin-film transistor TFT, a light-emitting element EL, and a touch sensor TS disposed on the substrate 101 and in the display area AA. Embodiments are not limited thereto. As an example, the touch sensor TS may be omitted, and/or one or more components may be further included.

The substrate 101 may include glass or plastic material, without being limited thereto. As an example, the substrate 101 may include metal, ceramics, semiconductors, etc., without being limited thereto. For example, the substrate 101 may be embodied as a single layer or a multilayer including at least one of polyimide, polyethylene terephthalate, polyethylene naphthalate, polycarbonate, polyethersulfone, polyarylate, polysulfone, or cyclic-olefin copolymer. However, the present disclosure is not limited thereto. In one embodiment, the substrate 101 may be made of polyimide.

The thin-film transistor TFT may be disposed on the substrate 101 and in the display area AA. A buffer layer 105 may be formed on the substrate 101 (e.g., on the entirety of the substrate 101) to protect the thin-film transistor TFT from moisture, oxygen, etc. penetrating through the substrate 101. The buffer layer 105 may be embodied as, for example, a single layer or a multilayer made of an inorganic insulating material such as silicon nitride (SiNx), silicon oxide (SiOx), or silicon oxynitride (SiOxNy). However, the present disclosure is not limited thereto, for example, the buffer layer 105 may be omitted in some cases.

The thin-film transistor TFT may include a semiconductor layer 115, a gate electrode 125 disposed on the semiconductor layer 115, a gate insulating layer 120 disposed between the semiconductor layer 115 and the gate electrode 125, and a source electrode 140 and a drain electrode 141 connected to the semiconductor layer 115. The gate insulating layer 120 may be entirely disposed on the substrate 101, or may be only partially disposed between the gate electrode 125 and the semiconductor layer 115.

The semiconductor layer 115 may be made of an amorphous silicon semiconductor material, a polycrystalline silicon semiconductor material, an oxide semiconductor material, a compound semiconductor material, or an organic semiconductor material. However, the present disclosure is not limited thereto.

The gate insulating layer 120 may be embodied as a single layer or multiple layers made of an inorganic material, for example, silicon oxide, silicon nitride, or silicon oxynitride. However, the present disclosure is not limited thereto. The gate insulating layer 120 may be formed by atomic layer deposition (ALD) method or metal organic chemical vapor deposition (MOCVD).

Each of the gate electrode 125, the source electrode 140, and the drain electrode 141 may be embodied as a single layer or multiple layers made of any one of molybdenum (Mo), aluminum (Al), chromium (Cr), gold (Au), silver (Ag), titanium (Ti), nickel (Ni), neodymium (Nd), copper (Cu) or an alloy thereof. However, the present disclosure is not limited thereto.

An interlayer insulating layer 135 covering the gate electrode 125 may be disposed. Each of the source electrode 140 and the drain electrode 141 may extend through the interlayer insulating layer 135 and the gate insulating layer 120 so as to be connected to the semiconductor layer 115.

The interlayer insulating layer 135 may be embodied as a single layer or multiple layers made of an inorganic material, for example, silicon oxide, silicon nitride, or silicon oxynitride. However, the present disclosure is not limited thereto.

A first planarization layer 150 covering the thin-film transistor TFT may be disposed on the interlayer insulating layer 135. The first planarization layer 150 may planarize a step caused by the thin-film transistor TFT.

The first planarization layer 150 may be made of an organic material. The first planarization layer 150 may be made of, for example, a non-photosensitive organic insulating material such as acryl resin, epoxy resin, phenolic resin, etc., or a photosensitive organic insulating material such as photosensitive polyimide, photo acryl, etc. However, the present disclosure is not limited thereto.

An interlayer connection electrode 155 may be disposed on the first planarization layer 150. The interlayer connection electrode 155 may extend through the first planarization layer 150 so as to be connected to the drain electrode 141 or the source electrode 140 of the thin-film transistor TFT. As an example, the interlayer connection electrode 155 may be omitted.

The interlayer connection electrode 155 may be embodied as a single layer or multiple layers made of any one of molybdenum (Mo), aluminum (Al), chromium (Cr), gold (Au), silver (Ag), titanium (Ti), nickel (Ni), neodymium (Nd), copper (Cu) or an alloy thereof. However, the present disclosure is not limited thereto.

A second planarization layer 160 covering the interlayer connection electrode 155 may be disposed on the first planarization layer 150.

The second planarization layer 160 may be made of an organic material. The second planarization layer 160 may be made of, for example, a non-photosensitive organic insulating material such as acryl resin, epoxy resin, phenolic resin, etc., or a photosensitive organic insulating material such as photosensitive polyimide, photo acryl, etc. However, the present disclosure is not limited thereto.

The light-emitting element EL and a bank 165 may be disposed on the second planarization layer 160.

The light-emitting element EL may include a first electrode 171, an organic light-emitting layer 172, and a second electrode 173. The first electrode 171 may be an anode electrode, and the second electrode 173 may be a cathode electrode, without being limited thereto.

Each of the first electrodes 171 may be disposed on the second planarization layer 160 and in each of the sub-pixels of the display area AA. The first electrode 171 may be connected to the interlayer connection electrode 155 extending through the second planarization layer 160. The first electrode 171 may be connected to the drain electrode 141 or the source electrode 140 of the thin-film transistor TFT via the interlayer connection electrode 155. In the case where the interlayer connection electrode 155 is omitted, the first electrode 171 may be connected to the drain electrode 141 or the source electrode 140 of the thin-film transistor TFT directly. The first electrode 171 may have a structure including conductive materials. As an example, the first electrode 171 may have a structure including a highly reflective material, for example, a stacked structure of aluminum and titanium (Ti/Al/Ti), a stacked structure of aluminum and ITO (ITO/Al/ITO), a stacked structure of silver (Ag) and ITO (ITO/Ag/ITO), an APC alloy, and a stacked structure of the APC alloy and ITO (ITO/APC/ITO). In this regard, the APC alloy is an alloy of silver (Ag), palladium (Pd), and copper (Cu). Embodiments are not limited thereto. As an example, the first electrode 171 may have a structure including other conductive materials.

The bank 165 may be disposed so as to cover a partial area of the first electrode 171 while being disposed on the second planarization layer 160. Accordingly, the bank 165 may have an opening defined therein exposing a remaining area of the first electrode 171, wherein each opening is defined in each sub-pixel of the display area AA. The bank 165 may have the same number of openings as the number of sub-pixels, without being limited thereto. As an example, the bank 165 may have a larger number of openings than the number of sub-pixels.

The bank 165 may be made of an organic material. The bank 165 may be made of, for example, a non-photosensitive organic insulating material such as acryl resin, epoxy resin, phenolic resin, etc., or a photosensitive organic insulating material such as photosensitive polyimide, photo acryl, etc. Alternatively, the bank 165 may include an inorganic insulating material such as silicon nitride, aluminum nitride, zirconium nitride, titanium nitride, hafnium nitride, tantalum nitride, silicon oxide, aluminum oxide, or titanium oxide, etc. However, the present disclosure is not limited thereto. The bank 165 may be made of an opaque material.

The organic light-emitting layer 172 may be disposed on the first electrode 171 and the bank 165. The organic light-emitting layer 172 may include a hole transport layer, at least one light-emitting material layer, and an electron transport layer. As an example, at least one of the hole transport layer and the electron transport layer may be omitted. As an example, the organic light-emitting layer 172 may emit white light. The white light generated from the organic light-emitting layer 172 may pass through red, green, and blue color filters located on top of the organic light-emitting layer 172 and then be emitted as red, green, and blue lights, respectively. In one embodiment, the separate color filter may be absent and the organic light-emitting layer 172 may include a red light-emitting material layer, a green light-emitting material layer, or a blue light-emitting material layer in each sub-pixel. Light-emitting material layers of other colors are also possible.

The second electrode 173 may be disposed on the organic light-emitting layer 172. The second electrode 173 may be made of a conductive material capable of transmitting light therethrough. For example, the second electrode 173 may be made of a transparent conductive oxide (TCO) such as ITO or IZO.

An encapsulation layer 180 may be disposed on the light-emitting element EL. The encapsulation layer 180 serves to prevent external oxygen or moisture from penetrating into the light-emitting element EL. The encapsulation layer 180 may include at least one inorganic film and at least one organic film. For example, the encapsulation layer 180 may have a three-layer structure in which a first inorganic film 181, an organic film 182, and a second inorganic film 183 are stacked, without being limited thereto.

As an example, each of the first inorganic film 181 and the second inorganic film 183 may be made of an inorganic insulating material which can be deposited at a low-temperature, such as silicon nitride (SiNx), silicon oxide (SiOx), silicon oxynitride (SiOxNy), or aluminum oxide (AlxOy). The first encapsulation layer 181 and the third encapsulation layer 183 are deposited in a low temperature atmosphere. Thus, during a deposition process of the first encapsulation layer 181 and the third encapsulation layer 183, damage to the light-emitting element EL which is vulnerable to a high temperature atmosphere may be reduced or prevented.

The organic film 182 as the second encapsulation layer may planarize a step caused by the bank 165 and the light-emitting element EL. The organic film 182 may be made of an organic insulating material. The organic film 182 may be made of, for example, a non-photosensitive organic insulating material such as acryl resin, epoxy resin, phenolic resin, etc., or a photosensitive organic insulating material such as photosensitive polyimide, photo acryl, etc. However, the present disclosure is not limited thereto. The bank 165 may be made of an opaque material.

The touch sensor TS may be disposed on the encapsulation layer 180. The touch sensor TS may include touch electrodes 195 and bridge electrodes 192 and 194.

A touch buffer layer 191 may be disposed on the encapsulation layer 180. The touch buffer layer 191 may prevent a solution (developer or etchant, etc.) used in a manufacturing process of the touch electrodes or moisture from the outside from penetrating into the organic light-emitting layer 172 to prevent or reduce damage of the organic light-emitting layer 172.

The touch buffer layer 191 may be made of an inorganic insulating material such as silicon nitride (SiNx), silicon oxide (SiOx), silicon oxynitride (SiOxNy), or aluminum oxide (AlxOy). The touch buffer layer 191 may be made of, for example, silicon nitride (SiNx).

The first bridge electrode 192 may be disposed on the touch buffer layer 191, and a touch insulating layer 193 may be disposed on the touch buffer layer 191 so as to cover the first bridge electrode 192. The touch insulating layer 193 may be made of an inorganic insulating material such as silicon nitride (SiNx), silicon oxide (SiOx), silicon oxynitride (SiOxNy), or aluminum oxide (AlxOy). The touch insulating layer 193 may be made of, for example, silicon nitride (SiNx).

The touch electrodes 195 and the second bridge electrode 194 may be disposed on the touch insulating layer 193. The touch electrodes 195 may extend through the touch insulating layer 193 so as to be connected to the first bridge electrode 192. As an example, the first and second bridge electrodes 192 and 194 may vertically overlap the bank 165, thereby preventing decrease in an aperture ratio of the sub-pixel, without being limited thereto. As an example, at least a portion of the first and second bridge electrodes 192 and 194 may not vertically overlap the bank 165. As an example, at least some of the first and second bridge electrodes 192 and 194 may be formed of a transparent conductive oxide (TCO) such as ITO or IZO, without being limited thereto.

Each of the touch electrodes 195, the first bridge electrode 192, and the second bridge electrode 194 may be embodied as a single layer or multiple layers made of any one of molybdenum (Mo), aluminum (Al), chromium (Cr), gold (Au), silver (Ag), titanium (Ti), nickel (Ni), neodymium (Nd), copper (Cu) or an alloy thereof. However, the present disclosure is not limited thereto. Each of the touch electrodes 195, the first bridge electrode 192, and the second bridge electrode 194 may have, for example, a Ti/Al/Ti stacked structure.

A touch protection layer 197 may be disposed on the touch electrodes 195. The touch protection layer 197 may be made of an organic material. The touch protection layer 197 may be made of, for example, a non-photosensitive organic insulating material such as acryl resin, epoxy resin, phenolic resin, etc., or a photosensitive organic insulating material such as photosensitive polyimide, photo acryl, etc. However, the present disclosure is not limited thereto.

Moreover, a color filter (not shown) may be further disposed on the encapsulation layer 180, and the color filter may be located between the encapsulation layer 180 and the touch buffer layer 191 or on the touch protection layer 197. The color filter may be omitted depending on the design of the display device 100.

FIG. 3 shows a portion of the first pad area PA1 where the data driver chip D-IC is mounted.

Referring to FIG. 3, a plurality of input pads PD1 and a plurality of output pads PD2 are disposed in the first pad area PA1. The data driver chip D-IC may include a plurality of input bumps BP1 which are electrically connected to the plurality of input pads PD1, respectively, and a plurality of output bumps BP2 which are electrically connected to the plurality of output pads PD2, respectively.

The plurality of input pads PD1 may extend in a first direction. Moreover, the plurality of output pads PD2 may extend in the first direction. The plurality of input pads PD1 may be spaced from the plurality of output pads PD2 in the first direction. The first direction may be, for example, a Y-axis direction or a direction inclined at a predetermined angle with respect to the Y-axis direction. As an example, the Y-axis direction may be, for example, a direction in which the first pad area PA1 extends from the display area AA. The plurality of input pads PD1 may be arranged so as to be spaced from each other by a predetermined spacing in a second direction that intersects the first direction. The plurality of output pads PD2 may be arranged so as to be spaced from each other by a predetermined spacing in the second direction that intersects the first direction. The second direction may be, for example, an X-axis direction or a direction inclined at a predetermined angle with respect to the X-axis direction.

Each of the plurality of input pads PD1 and the plurality of output pads PD2 may be made of the same material as that of the touch electrodes 195 of the touch sensor TS, without being limited thereto. As an example, each of the plurality of input pads PD1 and the plurality of output pads PD2 may be made of a material different from that of the touch electrodes 195 of the touch sensor TS. Each of the plurality of input pads PD1 and the plurality of output pads PD2 may be embodied as a single layer or multiple layers made of any one of molybdenum (Mo), aluminum (Al), chromium (Cr), gold (Au), silver (Ag), titanium (Ti), nickel (Ni), neodymium (Nd), copper (Cu) or an alloy thereof. However, the present disclosure is not limited thereto. For example, each of the plurality of input pads PD1 and the plurality of output pads PD2 may have a Ti/Al/Ti stacked structure.

The plurality of input bumps BP1 may be disposed under the data driver chip D-IC and may be arranged so as to be spaced from each other by the same spacing as the spacing between adjacent ones of the plurality of input pads PD1. The plurality of output bumps BP2 may be disposed under the data driver chip D-IC and may be arranged so as to be spaced from each other by the same spacing as the spacing between adjacent ones of the plurality of output pads PD2.

The plurality of input bumps BP1 may extend in the first direction. A length of each of the plurality of input bumps BP1 may be larger than a length of corresponding one of the plurality of input pads PD1. Moreover, the plurality of output bumps BP2 may extend in the first direction. A length of each of plurality of output bumps BP2 may be larger than a length of corresponding one of the plurality of output pads PD2.

In a top view of the display device, four crack blocking layers CRB that overlap ends of the plurality of input bumps BP1 and ends of the plurality of output bumps BP2 may be disposed in the first pad area PA1. The crack blocking layers CRB may partially overlap the ends of the plurality of input bumps BP1 and the ends of the plurality of output bumps BP2. The crack blocking layers (CRB) may be disposed adjacent to the plurality of input pads (PD1) and the plurality of output pads (PD2). The crack blocking layers CRB may partially overlap the ends of the input pads PD1 and the ends of the output pads PD2. Embodiments are not limited thereto. As an example, one or more crack blocking layers CRB may be disposed in the first pad area PA1 to overlap at least one of the ends of the plurality of input bumps BP1 and the ends of the plurality of output bumps BP2.

Each of the crack blocking layers CRB may have, for example, a bar shape extending in the second direction (e.g., the X-axis direction) intersecting the first direction. However, the present disclosure is not limited thereto.

A width (a dimension in the first direction) of each of the crack blocking layers CRB may be appropriately designed in consideration of misalignment of the data driver chip D-IC in the first direction (e.g., the Y-axis direction).

A direction in which the crack blocking layers CRB extends may vary based on arrangement positions of the plurality of input pads PD1 and the plurality of input bumps BP1, and arrangement positions of the plurality of output pads PD2 and the plurality of output bumps BP2. In some cases, the directions in which the crack blocking layers CRB extend, respectively may not be uniform.

The four crack blocking layers CRB may be spaced apart from each other. One crack blocking layer CRB may overlap one ends of the plurality of input bumps BP1 within the first pad area PA1. One crack blocking layer CRB may overlap the other ends of the plurality of input bumps BP1 within the first pad area PA1. One crack blocking layer CRB may overlap one ends of the plurality of output bumps BP2 within the first pad area PA1. One crack blocking layer CRB may overlap the other ends of the plurality of output bumps BP2 within the first pad area PA1.

The crack blocking layers CRB may be made of the same material as that of the first bridge electrode 192 of the touch sensor TS, without being limited thereto. As an example, the crack blocking layers CRB may be made of a material different from that of the first bridge electrode 192 of the touch sensor TS. Each of the crack blocking layers CRB may be embodied as a single layer or multiple layers made of any one of molybdenum (Mo), aluminum (Al), chromium (Cr), gold (Au), silver (Ag), titanium (Ti), nickel (Ni), neodymium (Nd), copper (Cu) or an alloy thereof. However, the present disclosure is not limited thereto. Each of the crack blocking layers CRB may have, for example, a Ti/Al/Ti layered structure.

FIG. 4 shows a cross-sectional structure around the input pad PD1 of the first pad area PA1.

Referring to FIG. 4, the buffer layer 105 and the gate insulating layer 120 may be disposed on the substrate 101. Unlike what shown in FIG. 4, in one embodiment, only one of the buffer layer 105 and the gate insulating layer 120 may be disposed on the substrate 101. In one embodiment, the buffer layer 105 and the interlayer insulating layer 135 may be disposed on the substrate 101. In one embodiment, the buffer layer 105, the gate insulating layer 120, and the interlayer insulating layer 135 may be disposed on the substrate 101. In one embodiment, the gate insulating layer 120 and the interlayer insulating layer 135 may be disposed on the substrate 101. As an example, at least one of the buffer layer 105, the gate insulating layer 120, and the interlayer insulating layer 135 may be disposed on the substrate 101.

A signal line 157 may be disposed on the gate insulating layer 120. The signal line 157 may extend to the second pad area PA2 so as to be connected to the external driving module.

The signal line 157 may be made of the same material as that of one of the source electrode 140, the drain electrode 141, and the connection electrode 155, without being limited thereto. The signal line 157 may be embodied as a single layer or multiple layers made of any one of molybdenum (Mo), aluminum (Al), chromium (Cr), gold (Au), silver (Ag), titanium (Ti), nickel (Ni), neodymium (Nd), copper (Cu) or an alloy thereof. However, the present disclosure is not limited thereto. The signal line 157 may have, for example, a Ti/Al/Ti stacked structure.

The second planarization layer 160 exposing a portion of the signal line 157 may be disposed on the signal line 157. A portion of the second planarization layer 160 disposed in the first pad area PA1 may be referred to as an organic pad insulating layer.

The touch buffer layer 191 exposing a portion of the signal line 157 may be disposed on the second planarization layer 160. The touch buffer layer 191 may cover a side surface of the second planarization layer 160. A portion of the touch buffer layer 191 disposed in the first pad area PA1 may be referred to as a first inorganic pad insulating layer.

Moreover, the crack blocking layers CRB may be disposed on the touch buffer layer 191 so as to overlap the input bumps BP1 of the data driver chip D-IC.

The touch insulating layer 193 may be disposed on the crack blocking layers CRB, and the touch insulating layer 193 may cover the touch buffer layer 191. The touch insulating layer 193 may not cover a portion of the signal line 157 so that the portion of the signal line 157 is exposed. The crack blocking layer CRB may be disposed between the touch insulating layer 193 and the touch buffer layer 191. A portion of the touch insulating layer 193 disposed in the first pad area PA1 may be referred to as a second inorganic pad insulating layer.

The input pad PD1 contacts the signal line 157 and is disposed on the signal line 157. The input pad PD1 may extend in the first direction (e.g., Y-axis direction) such that the end of the input pad PD1 may cover the portion of the touch insulating layer 193.

The cross-sectional structure around the input pad PD1 is described with reference to FIG. 4. This may be equally applied to a cross-sectional structure around the output pad PD2.

The data driver chip D-IC may be mounted on the first pad area PA1 using the anisotropic conductive film ACF.

The input pad PD1 of the first pad area PA1 and the input bump BP1 of the data driver chip D-IC may be electrically connected to each other via the conductive balls CBL received in the anisotropic conductive film ACF. Likewise, the output pad PD2 of the first pad area PA1 and the output bump BP2 of the data driver chip D-IC may be electrically connected to each other via the conductive balls CBL received in the anisotropic conductive film ACF.

A pressure is applied during a process of mounting the data driver chip D-IC on the first pad area PA1 using the anisotropic conductive film ACF.

However, a length of the input bump BP1 is larger than that of the input pad PD1. Thus, when the conductive balls CBL is present outside the input pad PD1, the conductive balls CBL pressed by the input bump BP1 may cause cracks in the touch insulating layer 193. For the same reason as described above, the cracks due to the pressed conductive balls CBL may also occur in the touch insulating layer 193 under the output bump BP2.

When the touch buffer layer 191 is disposed directly under the touch insulating layer 193, the cracks occurring in the touch insulating layer 193 propagates to the touch buffer layer 191, and thus the moisture may invade along the cracks, thereby causing a lower surface of the touch buffer layer 191 to be oxidized. As a result, a bonding force between the touch buffer layer 191 and the second planarization layer 160 may be weakened, so that the touch buffer layer 191 may be separated from the second planarization layer 160.

In this embodiment, the crack blocking layer CRB made of metal is disposed immediately under the touch insulating layer 193. Thus, even when the cracks occur in the touch insulating layer 193 due to the conductive balls CBL pressed by the input and output bumps BP1 and BP2, the crack propagation may be blocked by the crack blocking layer CRB such that crack propagation to the touch buffer layer 191 may be reduced or prevented.

Therefore, the cracks that act as a moisture penetration path do not occur in the touch buffer layer 191. Thus, the lower surface of the touch buffer layer 191 may be prevented from being oxidized due to the moisture. Further, the touch buffer layer 191 may be prevented from being separated from the second planarization layer 160. Furthermore, the input and output pads PD1 and PD2 may be prevented from being separated from the signal lines 157.

Figure 5:
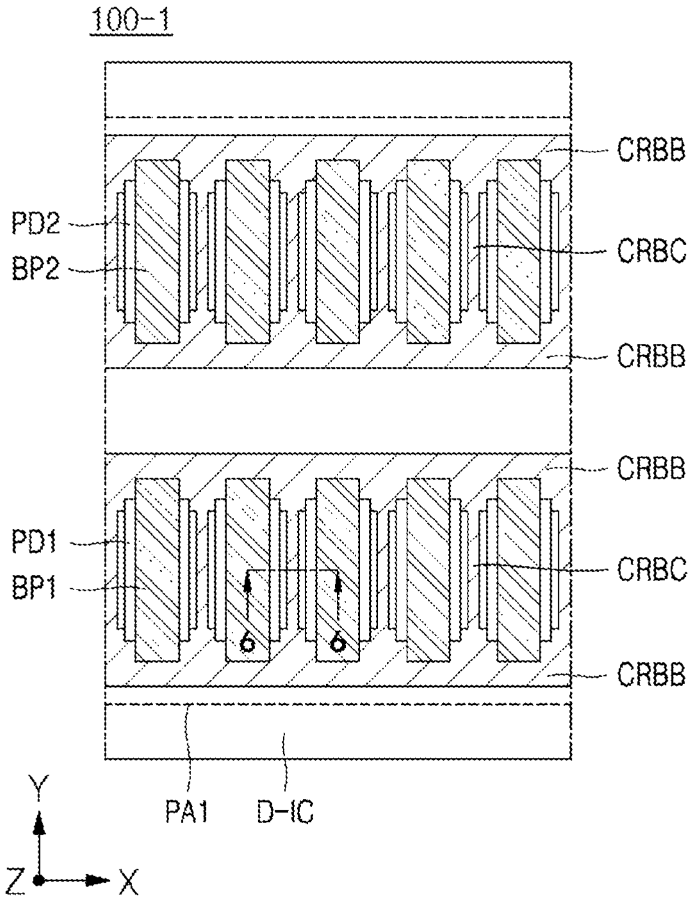
FIG. 5 is a plan view showing a display device according to one embodiment of the present disclosure.
Figure 6:
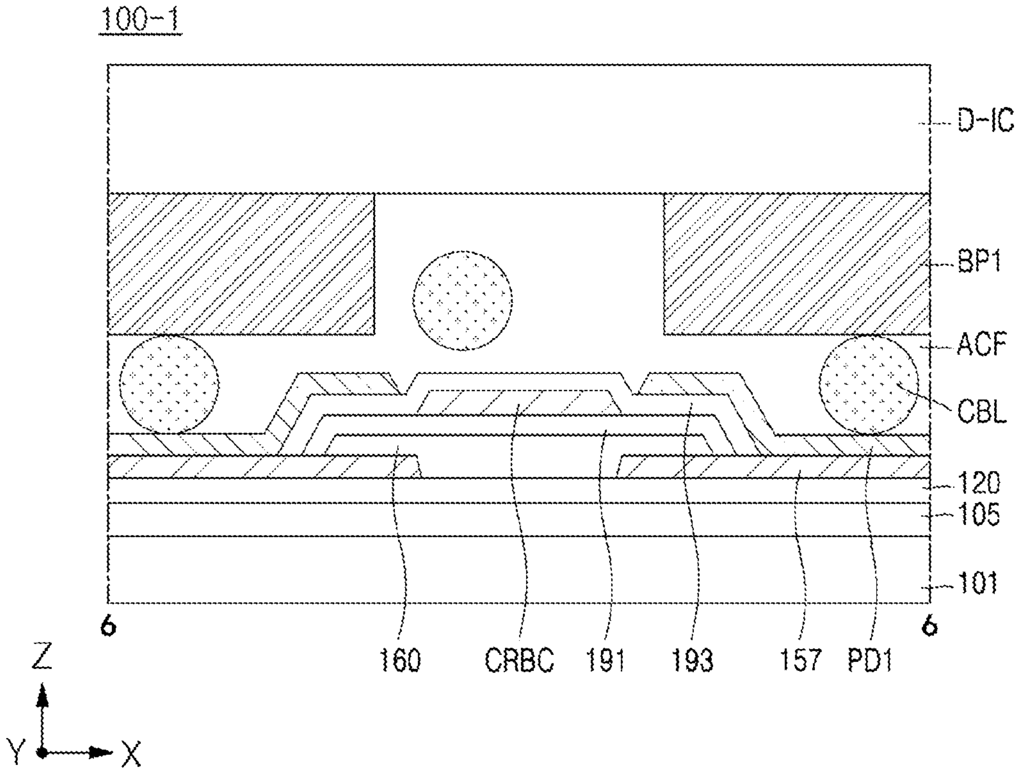
FIG. 6 is a cross-sectional view cut along a line 6-6 in FIG. 5.
Figure 7:
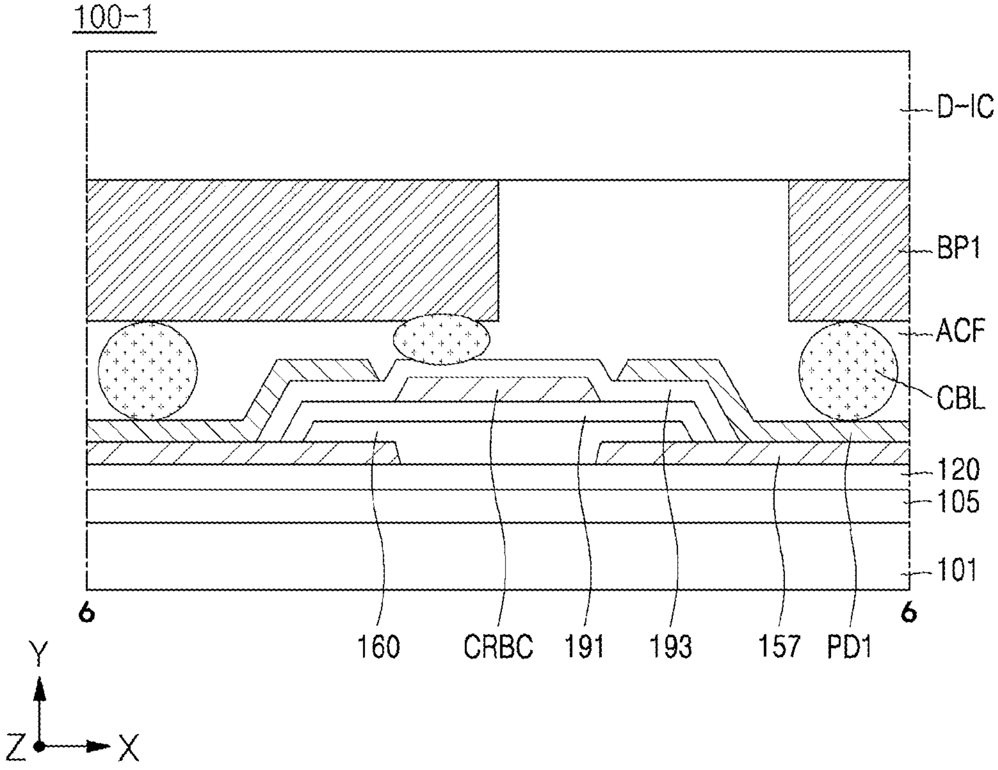
FIG. 7 is a cross-sectional view showing a data driver chip in a misaligned state in one direction.

FIG. 5 is a plan view showing a display device 100-1 according to one embodiment of the present disclosure. FIG. 6 is a cross-sectional view cut along a 6-6 line in FIG. 5. FIG. 7 is a cross-sectional view showing bumps in a misaligned state in one direction.

Referring to FIG. 5, in the display device 100-1, in a top view of the display device 100-1, in the first pad area PA1, four first crack blocking layers CRBB may be disposed so as to overlap the ends of the plurality of input bumps BP1 and the ends of the plurality of output bumps BP2.

Each of the first crack blocking layers CRBB may for example, extend in the second direction (e.g., X-axis direction) intersecting the first direction. However, the present disclosure is not limited thereto. As an example, the first crack blocking layers CRBB may be disposed at locations corresponding to each of the ends of the plurality of input bumps BP1 and the ends of the plurality of output bumps BP2, without being limited thereto.

A direction in which the first crack blocking layers CRBB extend may vary based on the arrangement positions of the plurality of input pads PD1 and the plurality of input bumps BP1, and the arrangement positions of the plurality of output pads PD2 and the plurality of output bumps BP2. In some cases, the directions in which the first crack blocking layers CRBB extend, respectively may not be uniform.

The four first crack blocking layers CRBB may be spaced apart from each other. One first crack blocking layer CRBB may overlap one ends of the plurality of input bumps BP1 in the first pad area PA1. One first crack blocking layer CRBB may overlap the other ends of the plurality of input bumps BP1 in the first pad area PA1. One first crack blocking layer CRBB may overlap one ends of the plurality of output bumps BP2 in the first pad area PA1. One first crack blocking layer CRBB may overlap the other ends of the plurality of output bumps BP2 in the first pad area PA1.

The two first crack blocking layers CRBB that respectively overlap one ends and the other ends of the plurality of input bumps BP1 may be connected to each other via a plurality of second crack blocking layers CRBC. Each of the second crack blocking layers CRBC may be disposed in an area between two adjacent input pads PD1.

The two first crack blocking layers CRBB that respectively overlap one ends and the other ends of the plurality of output bumps BP2 may be connected to each other via a plurality of second crack blocking layers CRBC. Each of the second crack blocking layers CRBC may be disposed in an area between two adjacent output pads PD2.

The plurality of second crack blocking layers CRBC may extend in the first direction in which the plurality of input pads PD1 and output pads PD2 extend.

The first and second crack blocking layers CRBB and CRBC may be disposed in the same layer and may be made of the same material. Each of the first and second crack blocking layers CRBB and CRBC may be made of the same material as that of the first bridge electrode 192 of the touch sensor TS, without being limited thereto. Each of the first and second crack blocking layers CRBB and CRBC may be embodied as a single layer or multiple layers made of any one of molybdenum (Mo), aluminum (Al), chromium (Cr), gold (Au), silver (Ag), titanium (Ti), nickel (Ni), neodymium (Nd), copper (Cu) or an alloy thereof. However, the present disclosure is not limited thereto. Each of the first and second crack blocking layers CRBB and CRBC may have, for example, a Ti/Al/Ti layered structure.

Referring to FIG. 6, the buffer layer 105 and the gate insulating layer 120 may be disposed on the substrate 101. In one embodiment, instead of the gate insulating layer 120, the interlayer insulating layer 135 may be disposed thereon. Alternatively, the interlayer insulating layer 135 may be disposed on the gate insulating layer 120.

The signal lines 157 may be disposed on the gate insulating layer 120. The signal lines 157 may extend to the second pad area PA2 so as to be connected to the external driving module. For example, each of the signal lines 157 may have a Ti/Al/Ti stacked structure.

The second planarization layer 160 exposing a portion of each of the signal lines 157 may be disposed on each of the signal lines 157. The second planarization layer 160 may be further disposed in an area between the signal lines 157. The touch buffer layer 191 exposing a portion of each of the signal lines 157 may be disposed on the second planarization layer 160. The touch buffer layer 191 may cover the side surface of the second planarization layer 160.

Moreover, the second crack blocking layer CRBC may be disposed on the touch buffer layer 191 so as to overlap an area between the signal lines 157.

The touch insulating layer 193 may be disposed on the second crack blocking layer CRBC, and the touch insulating layer 193 may cover the touch buffer layer 191. The touch insulating layer 193 may expose a portion of the signal line 157. The second crack blocking layer CRBC may be disposed between the touch insulating layer 193 and the touch buffer layer 191.

The input pad PD1 may be disposed on the signal line 157 and may extend in the second direction (e.g., the X-axis direction) so as to cover a portion of the touch insulating layer 193.

The cross-sectional structure around the input pad PD1 is described with reference to FIG. 6. However, this may be equally applied to a cross-sectional structure around the output pad PD2.

The data driver chip D-IC may be mounted on the first pad area PA1 via the anisotropic conductive film ACF.

The input pads PD1 of the first pad area PA1 and the input bumps BP1 of the data driver chip D-IC may be electrically connected to each other via the conductive balls CBL received in the anisotropic conductive film ACF. Likewise, the output pads PD2 of the first pad area PA1 and the output bumps BP2 of the data driver chip D-IC may be electrically connected to each other via the conductive balls CBL received in the anisotropic conductive film ACF.

When the input bumps BP1 of the data driver chip D-IC are well aligned with the input pads PD1 of the first pad area PA1, respectively, the conductive balls CBL existing between the input bumps BP1 may not apply the pressure to the touch insulating layer 193.

However, as shown in FIG. 7, when the data driver chip D-IC is misaligned in the second direction (e.g., the X-axis direction) with respect to the first pad area PA1, the input bumps BP1 may be shifted in the second direction (e.g., the X-axis direction) with respect to the input pads PD1. In this case, the conductive balls CBL pressed by the input bump BP1 in the process in which the data driver chip D-IC is mounted may cause cracks in the touch insulating layer 193. For the same reason as described above, the cracks may also occur in a portion of the touch insulating layer 193 under the output bump BP2 due to the pressed conductive balls CBL.

In this embodiment, the second crack blocking layer CRBC made of metal is disposed directly under the touch insulating layer 193, and between two adjacent input pads PD1, and between two adjacent output pads PD2. Thus, even when the input and output bumps BP1 and BP2 of the data driver chip D-IC are misaligned with respect to the input and output pads PD1 and PD2 in the second direction (e.g., the X-axis direction) and thus the crack occurs in a portion of the touch insulating layer 193 between the input and output pads PD1 and PD2, the crack propagation may be blocked by the second crack blocking layer CRBC, thereby preventing the crack from propagating to the touch buffer layer 191.

Therefore, the cracks that act as a moisture penetration path do not occur in the touch buffer layer 191. Thus, the lower surface of the touch buffer layer 191 may be prevented from being oxidized due to the moisture. Further, the touch buffer layer 191 may be prevented from being separated from the second planarization layer 160. Furthermore, the input and output pads PD1 and PD2 may be prevented from being separated from the signal lines 157.

The display device according to embodiments of the present disclosure may be described as follows.

One aspect of the present disclosure provides a display device comprising: a substrate including a display area and a non-display area surrounding the display area, wherein the non-display area has a pad area; pads disposed on the substrate and in the pad area; crack blocking layers disposed on the substrate and in the pad area, and positioned adjacent to ends of the pads; and a data driver chip mounted on the substrate and in the pad area via an anisotropic conductive film, wherein the data driver chip includes bumps respectively connected to the pads, wherein the crack blocking layers overlap ends of the bumps in in a plan view of the display device.

According to some embodiments of the present disclosure, the display device further comprises: signal lines disposed on the substrate and in the pad area; an organic pad insulating layer disposed on the signal line and in the pad area so as to expose a portion of each of the signal lines; a first inorganic pad insulating layer disposed on the organic pad insulating layer and in the pad area so as to expose a portion of each of the signal lines; and a second inorganic pad insulating layer disposed on the first inorganic pad insulating layer and in the pad area, wherein the crack blocking layers are disposed between the second inorganic pad insulating layer and the first inorganic pad insulating layer.

According to some embodiments of the present disclosure, the pads are respectively in contact with the signal lines, wherein each of the pads extends such that an end of each of the pads cover a portion of the second inorganic pad insulating layer.

According to some embodiments of the present disclosure, each of the crack blocking layers includes at least one metal layer.

According to some embodiments of the present disclosure, each of the crack blocking layers has a stack structure of a Ti layer/Al layer/Ti layer.

According to some embodiments of the present disclosure, each of the crack blocking layers has a bar shape extending in a second direction intersecting a first direction, wherein the pads extend in the first direction.

According to some embodiments of the present disclosure, the crack blocking layers are spaced apart from each other in the plan view.

According to some embodiments of the present disclosure, the crack blocking layers include: first crack blocking layers spaced apart from each other in the plan view; and second crack blocking layers connecting adjacent ones of the first crack blocking layers to each other.

According to some embodiments of the present disclosure, each of the second crack blocking layers is disposed between two adjacent pads, and extends in the same direction as a direction in which the pads extend.

According to some embodiments of the present disclosure, the second crack blocking layers and the first crack blocking layers are positioned in the same layer and are made of the same material.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A display device comprising:

a substrate including a display area and a non-display area disposed around the display area, wherein the non-display area has a pad area;

pads disposed on the substrate and in the pad area;

crack blocking layers disposed on the substrate and in the pad area, and positioned adjacent to ends of the pads; and a data driver chip mounted on the substrate and in the pad area, wherein the data driver chip includes bumps respectively connected to the pads, wherein the crack blocking layers overlap ends of the bumps in a plan view of the display device, wherein the display device further comprises:

signal lines disposed on the substrate and in the pad area;

an organic pad insulating layer disposed on the signal line and in the pad area and exposing a portion of each of the signal lines;

a first inorganic pad insulating layer disposed on the organic pad insulating layer and in the pad area and exposing the portion of each of the signal lines; and a second inorganic pad insulating layer disposed on the first inorganic pad insulating layer and in the pad area, wherein the crack blocking layers are disposed between the second inorganic pad insulating layer and the first inorganic pad insulating layer.

2. The display device of claim 1, wherein the pads are respectively in contact with the signal lines, wherein each of the pads extends such that an end of each of the pads covers a portion of the second inorganic pad insulating layer.

3. The display device of claim 2, wherein each of the pads extends in a first direction such that an end of each of the pads cover a portion of the second inorganic pad insulating layer, wherein the first direction is a direction in which the pad area is spaced apart from the display area or a direction inclined at a predetermined angle with respect to the direction in which the pad area is spaced apart from the display area.

4. The display device of claim 3, wherein each of the pads further extends in a second direction that intersects the first direction such that an end of each of the pads cover a portion of the second inorganic pad insulating layer.

5. The display device of claim 1, wherein each of the crack blocking layers includes at least one metal layer.

6. The display device of claim 5, wherein each of the crack blocking layers has a stack structure of a Ti layer/Al layer/Ti layer.

7. The display device of claim 1, wherein each of the crack blocking layers has a bar shape extending in a second direction intersecting a first direction, wherein the pads extend in the first direction.

8. The display device of claim 1, wherein the crack blocking layers are spaced apart from each other in the plan view.

9. A display device comprising:

a substrate including a display area and a non-display area disposed around the display area, wherein the non-display area has a pad area;

pads disposed on the substrate and in the pad area;

crack blocking layers disposed on the substrate and in the pad area, and positioned adjacent to ends of the pads; and a data driver chip mounted on the substrate and in the pad area, wherein the data driver chip includes bumps respectively connected to the pads, wherein the crack blocking layers overlap ends of the bumps in a plan view of the display device, wherein the data driver chip is mounted on the substrate and in the pad area via an anisotropic conductive film, wherein a length of each of the bumps is larger than a length of corresponding one of the pads in a first direction in which the pads extend, and wherein the crack blocking layers overlap ends of the bumps protruding from the pads in the first direction, with a conductive ball of the anisotropic conductive film interposed therebetween.

10. The display device of claim 1, further comprising:

a touch buffer layer on the substrate and in the display area;

a first bridge electrode disposed on the touch buffer layer;

a touch insulating layer disposed on the touch buffer layer so as to cover the first bridge electrode, and touch electrodes and a second bridge electrode disposed on the touch insulating layer.

11. The display device of claim 10, wherein the crack blocking layers are made of the same material as that of the first bridge electrode.

12. The display device of claim 10, wherein the first inorganic pad insulating layer extends from the touch buffer layer in the display area, and the second inorganic pad insulating layer extends from the touch insulating layer in the display area.

13. The display device of claim 10, wherein the pads are made of the same material as that of the touch electrodes.

14. A display device comprising:

a substrate including a display area and a non-display area disposed around the display area, wherein the non-display area has a pad area;

pads disposed on the substrate and in the pad area;

crack blocking layers disposed on the substrate and in the pad area, and positioned adjacent to ends of the pads; and a data driver chip mounted on the substrate and in the pad area, wherein the data driver chip includes bumps respectively connected to the pads, wherein the crack blocking layers overlap ends of the bumps in a plan view of the display device, and wherein the crack blocking layers include:

first crack blocking layers spaced apart from each other in the plan view; and second crack blocking layers connecting adjacent ones of the first crack blocking layers to each other.

15. The display device of claim 14, wherein each of the second crack blocking layers is disposed between two adjacent pads, and extends in the same direction as a direction in which the pads extend.

16. The display device of claim 15, wherein the data driver chip is mounted on the substrate and in the pad area via an anisotropic conductive film, and wherein the bumps overlap the second crack blocking layers disposed between two adjacent pads, with a conductive ball of the anisotropic conductive film interposed therebetween.

17. The display device of claim 14, wherein the second crack blocking layers and the first crack blocking layers are positioned in a same layer and are made of a same material.

* * * * *